(12) United States Patent
Nagao

(10) Patent No.: US 8,198,662 B2
(45) Date of Patent: Jun. 12, 2012

(54) SEMICONDUCTOR MEMORY DEVICE AND METHOD OF MANUFACTURING THE SAME

(75) Inventor: Takeshi Nagao, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 623 days.

(21) Appl. No.: 12/171,322

(22) Filed: Jul. 11, 2008

(65) Prior Publication Data

US 2009/0065838 A1    Mar. 12, 2009

(30) Foreign Application Priority Data

Sep. 12, 2007  (JP) ................................. 2007-236213

(51) Int. Cl.
    *H01L 31/062*  (2006.01)
(52) U.S. Cl. .................................. 257/298; 257/E21.68
(58) Field of Classification Search .................... 257/71, 257/298, 300, 347, E21.682, E21.703, E27.103, 257/E27.112, 239, 261, 314–321, E29.129, 257/E29.3, E21.179, E21.422, E21.68
See application file for complete search history.

(56) References Cited

U.S. PATENT DOCUMENTS 7,714,370 B2 *  5/2010  Kurachi .................... 257/298

FOREIGN PATENT DOCUMENTS

JP  2001-229690  8/2001

* cited by examiner

*Primary Examiner* — Victor A Mandala
*Assistant Examiner* — Selim Ahmed
(74) *Attorney, Agent, or Firm* — Taft Stettinius & Hollister LLP

(57) ABSTRACT

An improved semiconductor memory device having a silicon on insulator (SOI) structure. Exemplary devices provide improved charge injection into the device's floating gate electrode. Exemplary devices may include a semiconductor substrate including a transistor forming region and a capacitor forming region; a MOSFET; a MOS capacitor; a projection formed within a periphery of the capacitor electrode of the MOS capacitor; and a floating gate electrode extending from the channel region of the MOSFET to overlap the projection of the capacitor electrode, with a gate insulating film interposed therebetween. The projection may include an inclined surface which may have a concave shape and/or the projection may extend above a capacitor groove having a undercut portion beneath the projection.

3 Claims, 9 Drawing Sheets

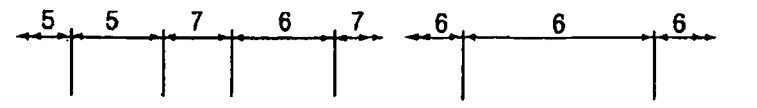
FIG. 5A
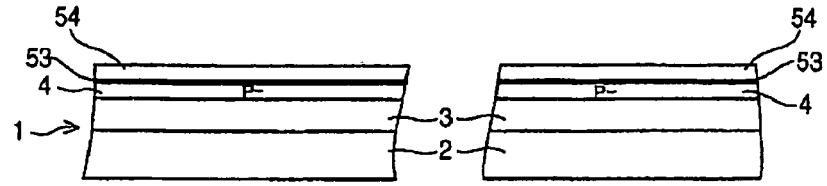
FIG. 5B
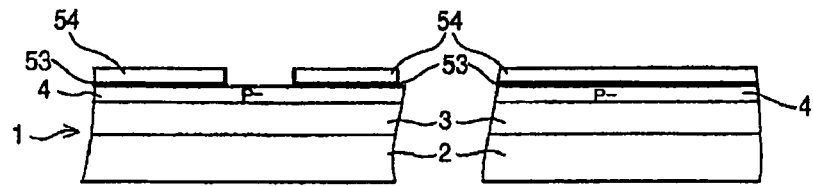
FIG. 5C
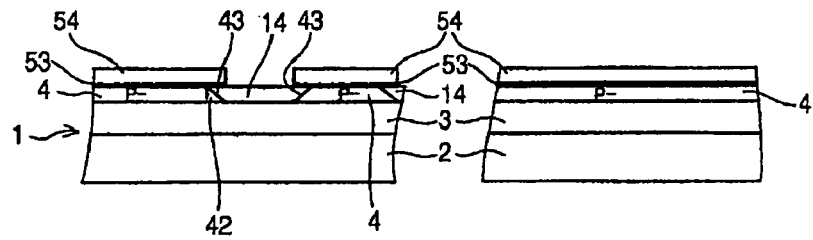
FIG. 5D
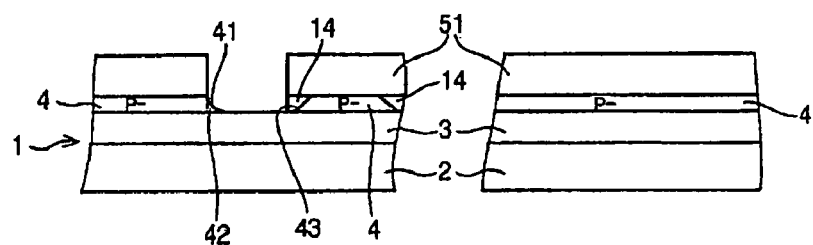
FIG. 5E
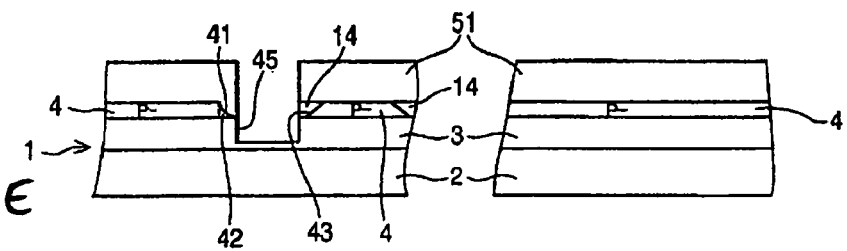

SEMICONDUCTOR MEMORY DEVICE AND METHOD OF MANUFACTURING THE SAME

CROSS REFERENCE TO RELATED APPLICATION

This application claims priority under 35 U.S.C. §119 to Japanese Patent Application Serial No. 2007236213 filed on Sep. 12, 2007, the disclosure of which is hereby incorporated by reference in its entirety.

RELATED ART

1. Field of the Invention

The present invention relates to a semiconductor memory device having an electrically programmable nonvolatile memory and a method of manufacturing the same.

2. Description of the Related Art

A conventional semiconductor memory device includes flash memory cells, each including two transistors which are respectively formed on a P well layer and an N well layer. The P well layer and the N well layer are connected in series via a floating gate electrode. During an erase operation, a control gate electrode and a drain layer are grounded and a voltage of 7 V is applied to a source layer. Electrons are drawn out of a tunnel current from the floating gate electrode to lower a threshold voltage of a flash memory. During a write operation, the drain layer is grounded and a voltage of 5 V is applied to the control gate electrode and to the source layer. Hot electrons are injected into the floating gate electrode to raise the threshold voltage of the flash memory to read stored data depending on the magnitude of the threshold voltage. See, for example, Japanese Patent Application Publication No. 2001-229690 (Paragraph [0011] on Page 5 to Paragraph [0021] on Page 6, and FIG. 1).

In the above-mentioned art, since the flash memory is formed on a bulk substrate, it is possible to inject charges into the floating gate electrode through a gate oxide film due to a high withstanding voltage between a source and a drain. However, in a complete depletion type semiconductor memory device using a semiconductor substrate having a SOI (Silicon On Insulator) structure including a SOI layer formed of a thin silicon layer laminated on a buried oxide film for the purpose of achieving smallness and thinness of the semiconductor memory device, it is difficult to sufficiently secure a source-drain withstanding voltage of a MOSFET (Metal Oxide Semiconductor Field Effect Transistor) formed on the SOI layer, and thus charges may not be injected into the floating gate electrode through the gate oxide film, which may result in a difficulty in forming an electrically programmable nonvolatile memory in a semiconductor memory device having the SOI structure.

Accordingly, the long time taken to inject charges into the floating gate electrode causes a long charge injection time prior to shipping, which may lead to high production costs.

The present invention has been made to overcome the above problems and it is an object of the invention to provide a means for injecting charges into a floating gate electrode of a semiconductor memory device having a SOI structure in a short time.

INTRODUCTION TO THE INVENTION

Embodiments of the invention provide improved semiconductor memory device having a silicon on insulator (SOI) structure. Exemplary devices provide improved charge injection into the device's floating gate electrode. Exemplary devices may include a semiconductor substrate including a transistor forming region and a capacitor forming region; a MOSFET; a MOS capacitor; a projection formed within a periphery of the capacitor electrode of the MOS capacitor; and a floating gate electrode extending from the channel region of the MOSFET to overlap the projection of the capacitor electrode, with a gate insulating film interposed therebetween. The projection may include an inclined surface which may have a concave shape and/or the projection may extend above a capacitor groove having a undercut portion beneath the projection.

In a first aspect, a semiconductor memory device according to the present invention may include a semiconductor substrate including a support substrate, an insulating layer formed over the support substrate, and a semiconductor layer formed over the insulating layer; an element isolation layer isolating a transistor forming region of the semiconductor layer from a capacitor forming region of the semiconductor layer; a MOSFET formed within the transistor forming region and including a source, a drain, and a doped region, the doped region interposing the source and the drain; a MOS capacitor formed within the capacitor forming region and including a capacitor electrode diffused with impurities having a conductivity type the same as the source; a projection formed within a periphery of the capacitor electrode of the MOS capacitor; a floating gate electrode overlapping the doped region of the MOSFET and extending to overlap the projection of the capacitor electrode; and a gate insulating film interposing the floating gate electrode and the projection of the capacitor electrode.

In a detailed embodiment of the first aspect, the projection may include an inclined surface extending to the insulating layer. The inclined surface may be concave. The device may include an undercut portion in the insulating layer, below the projection.

In another detailed embodiment of the first aspect, the device may include an undercut portion in the insulating layer below the projection.

In yet another detailed embodiment of the first aspect, the floating gate electrode may capacitively couple the doped region and the capacitor electrode.

In a second aspect, a semiconductor memory device, including a memory element including a MOSFET and a MOS capacitor according to the present invention may include a semiconductor substrate including a support substrate, an insulating layer formed over the support substrate, and a semiconductor layer formed over the insulating layer; a silicon nitride film over the semiconductor layer defining a transistor forming region and a capacitor forming region; an element isolation layer between the transistor forming region and the capacitor forming region; a projection provided within a periphery of the capacitor forming region of the semiconductor layer; a capacitor groove provided in the insulating layer; a gate insulating film over the semiconductor layer, over the element isolation layer, and within the capacitor groove; a floating gate electrode over the gate insulating film, the floating gate electrode dividing the semiconductor layer at an end portion of the transistor forming region, overlapping a doped region of the MOSFET, and overlapping the projection of the semiconductor layer of the capacitor forming region; a source and a drain of the MOSFET; and a capacitor electrode of the MOS capacitor.

In a detailed embodiment of the second aspect, the projection may include an inclined surface. The capacitor groove may include an undercut portion below the projection. The inclined surface of the projection may substantially entirely overlap the capacitor groove.

In another detailed embodiment of the second aspect, the capacitor groove may include an undercut portion below the projection. The projection may include an inclined surface. The inclined surface of the projection may substantially entirely overlap the capacitor groove.

In a third aspect, a method of manufacturing a semiconductor memory device including a memory element in which a MOSFET and a MOS capacitor formed over a semiconductor substrate including a support substrate, an insulating layer formed over the support substrate, and a semiconductor layer formed over the insulating layer are interconnected by a floating gate electrode, according to the present invention may include the steps of forming an element isolation layer between a transistor forming region of the semiconductor layer and a capacitor forming region of the semiconductor layer and forming a projection including an inclined surface extending to the insulating layer within a periphery of the capacitor forming region by oxidizing the exposed semiconductor layer by means of a LOCOS method; forming an inclined concave surface extending to the insulating layer on the projection by etching the element isolation layer by means of an isotropic etching method with selectivity to silicon; forming a capacitor groove in the insulating layer by etching the insulating layer by means of an anisotropic etching method; forming a gate insulating film over the semiconductor layer, over the element isolation layer, and over an inner surface of the capacitor groove; forming a floating gate electrode over the gate oxide film, the floating gate electrode dividing the semiconductor layer at an end portion of the transistor forming region, overlapping a doped region of the MOSFET, and extending to overlap the projection of the capacitor forming region of the semiconductor layer; and forming a source and a drain of the MOSFET and a capacitor electrode of the MOS capacitor by injecting impurities into the semiconductor layer on both sides of the floating gate electrode in the transistor forming region and into the semiconductor layer of the capacitor forming region.

In a fourth aspect, a method of manufacturing a semiconductor memory device including a memory element in which a MOSFET and a MOS capacitor formed on a semiconductor substrate including a support substrate, an insulating layer formed on the support substrate, and a semiconductor layer formed on the insulating layer are interconnected by a floating gate electrode, according to the present invention may include the steps of forming an element isolation layer between a transistor forming region of the semiconductor layer and a capacitor forming region of the semiconductor layer and forming a projection including an inclined surface extending to the insulating layer within a periphery of the capacitor forming region by oxidizing the exposed semiconductor layer by means of a LOCOS method; forming a capacitor groove in the insulating layer, the capacitor groove including an undercut portion below the projection, by etching the element isolation layer and the insulating layer by means of a wet etching method; forming a gate insulating film over the semiconductor layer, over the element isolation layer, and over an inner surface of the capacitor groove including the lower undercut portion; forming a floating gate electrode over the gate oxide film, the floating gate electrode dividing the semiconductor layer at an end portion of the transistor forming region, overlapping a doped region of the MOSFET, and extending to overlap the projection of the capacitor forming region of the semiconductor layer; and forming a source and a drain of the MOSFET and a capacitor electrode of the MOS capacitor by injecting impurities into the semiconductor layer on both sides of the floating gate electrode in the transistor forming region and into the semiconductor layer of the capacitor forming region.

In a detailed embodiment of the fourth aspect, the semiconductor memory device may include two of the memory elements linearly and symmetrically arranged so that the capacitor electrodes are proximately located with each other, and the step of forming the floating gate electrode may include the steps of forming a polysilicon film on the gate insulating film; etching the gate insulating film and the polysilicon film using an anisotropic etching method, thereby forming opposed floating gate electrodes, each of which divides the semiconductor layer at an end portion of the transistor forming region and extends to the projection of the semiconductor layer of the capacitor forming region; and cutting the polysilicon film by etching the polysilicon film remaining in the undercut portion by means of an isotropic etching method.

BRIEF DESCRIPTION OF THE DRAWINGS

FIGS. 5A-5E are cross-sectional views illustrating an exemplary manufacturing method for making a semiconductor memory device according the first exemplary embodiment;

DETAILED DESCRIPTION OF THE INVENTION

To accomplish the above object, a semiconductor memory device may include: a semiconductor substrate including a support substrate, an insulating layer formed on the support substrate, and a semiconductor layer formed on the insulating layer; an element isolation layer that isolates a transistor forming region from a capacitor forming region, both of the regions being defined on the semiconductor layer of the semiconductor substrate; a MOSFET formed on the semiconductor layer of the transistor forming region and including a source layer, a drain layer and a channel region interposed between the source layer and the drain layer; a MOS capacitor formed on the semiconductor layer of the capacitor forming region and including a capacitor electrode diffused with impurities having the same conductivity type as the source layer; a projection formed in a periphery of the capacitor electrode of the MOS capacitor and including an inclined concave surface extending to the insulating layer; and a floating gate electrode that extends from the channel region of the MOSFET to the projection of the capacitor electrode at an end portion of the MOSFET and faces the channel region and the capacitor electrode, with a gate insulating film interposed therebetween.

With this configuration, during an erase operation of the memory element, injecting charges into the floating gate electrode, irrespective of a source-drain withstanding voltage, using an electric field concentration by a leading edge of the projection having the inclined concave surface expanding to the insulating layer below the floating gate electrode of the capacitor electrode, it is possible to easily inject charges into the floating gate electrode, and, further, even for a semiconductor memory device having a SOI structure with a low source-drain withstanding voltage, it is possible inject charges into the floating gate electrode in a short time.

Hereinafter, a semiconductor memory device and a method of manufacturing the same according to exemplary embodiments, of the present invention are described with reference to the accompanying drawings.

Figure 1:
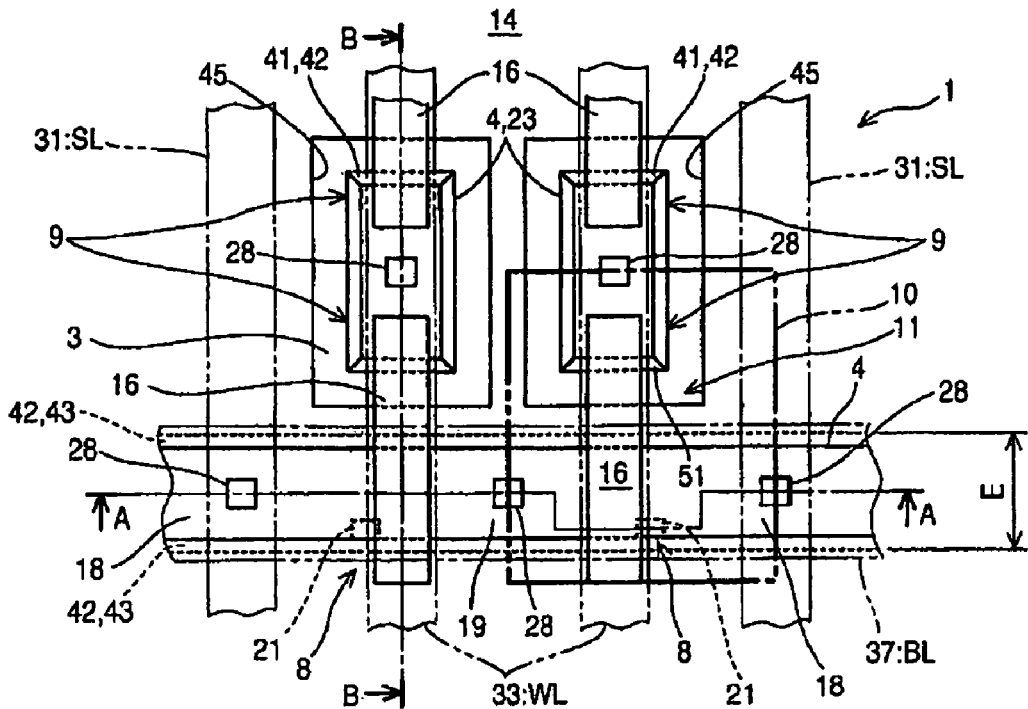
FIG. 1 is a plan view of a first exemplary embodiment of a semiconductor memory device according to the present invention.
Figure 2:
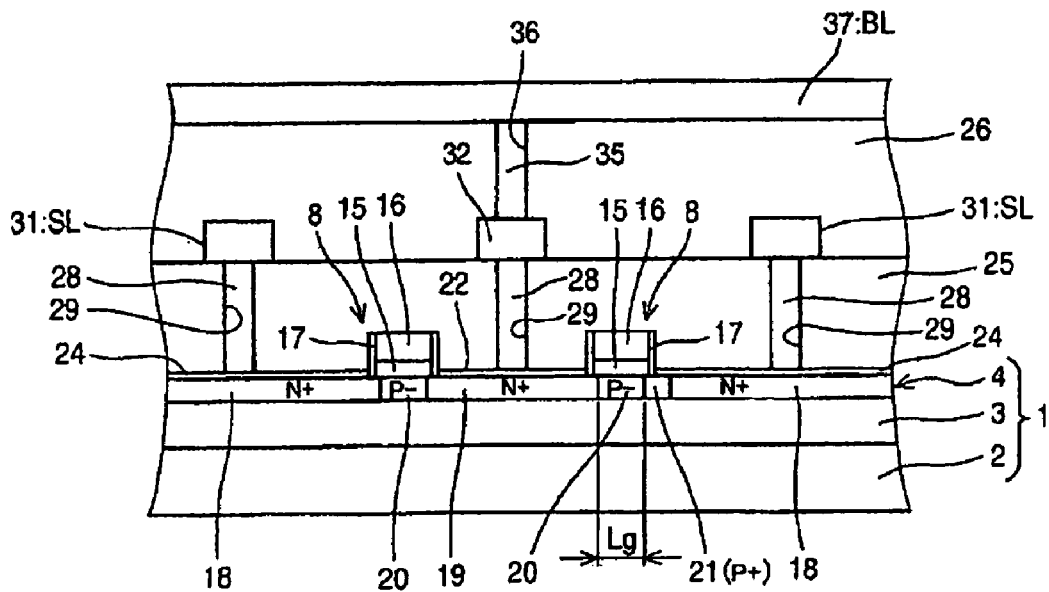
FIG. 2 is a cross-sectional view of the first exemplary semiconductor memory device taken along line A-A of FIG. 1.
Figure 3:
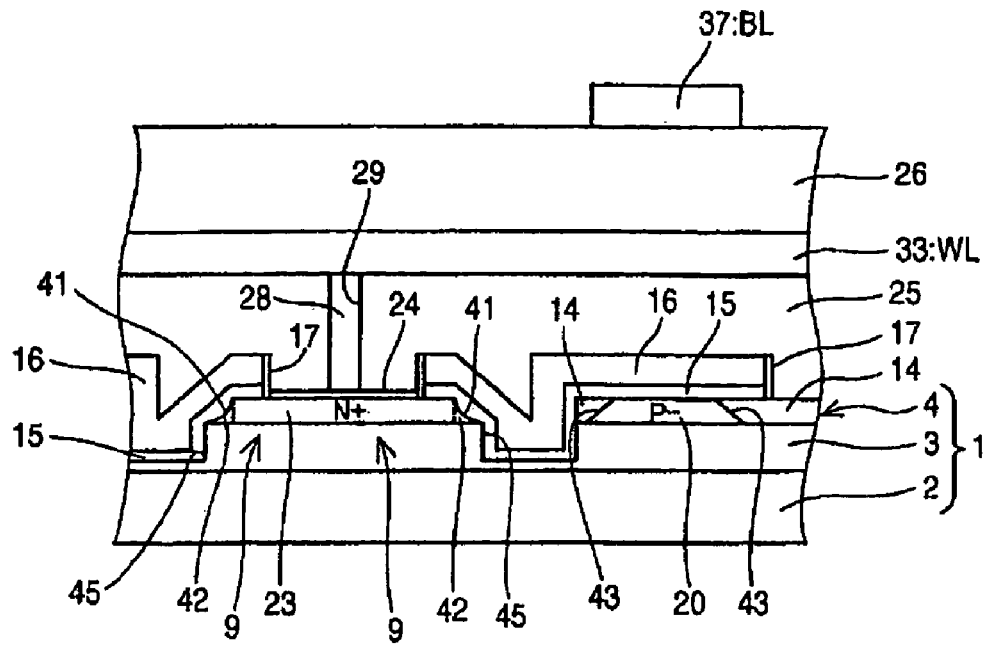
FIG. 3 is a cross-sectional view of the first exemplary semiconductor memory device taken along line B-B of FIG. 1.
Figure 4:
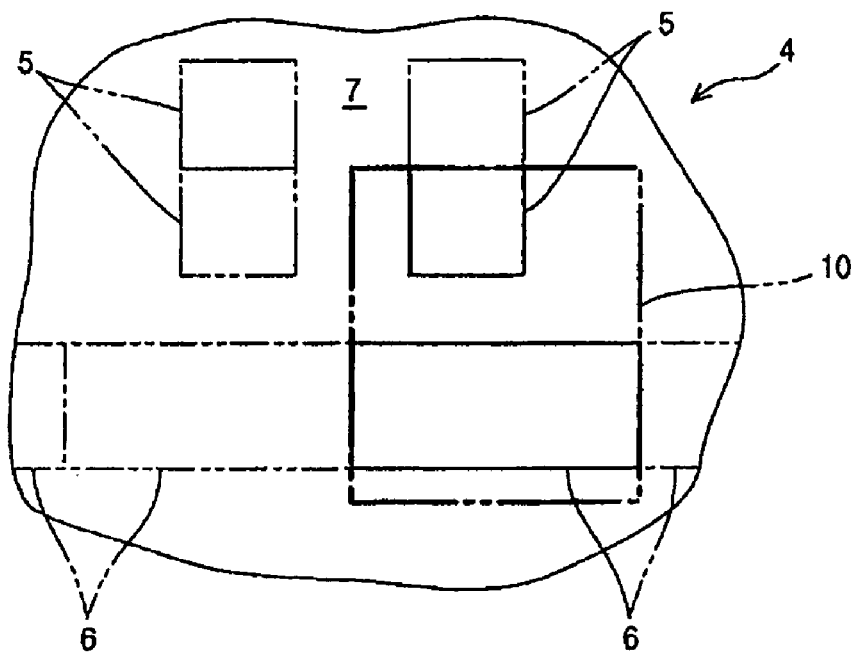
FIG. 4 is a schematic diagram illustrating regions on a SOI layer according to the first exemplary embodiment.
Figure 6A:
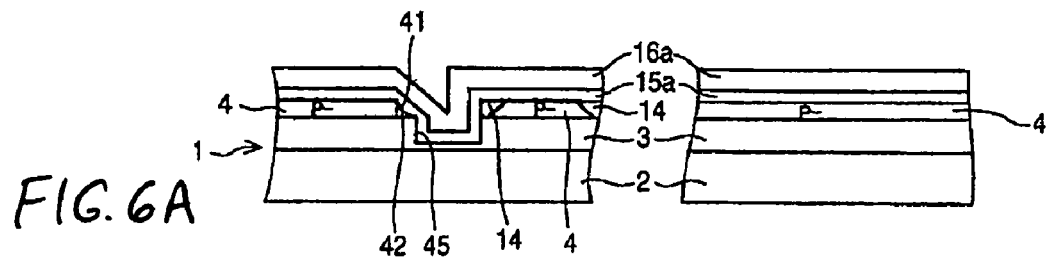
FIG. 6A-6D are cross-sectional views illustrating an exemplary manufacturing method for making a semiconductor memory device according to the first exemplary embodiment.
Figure 6B:
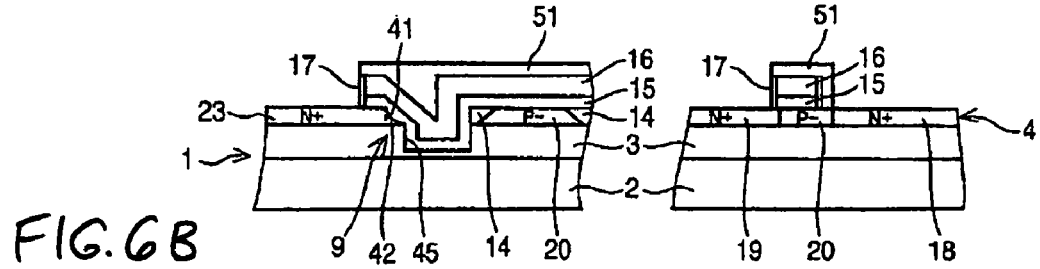
Figure 6C:
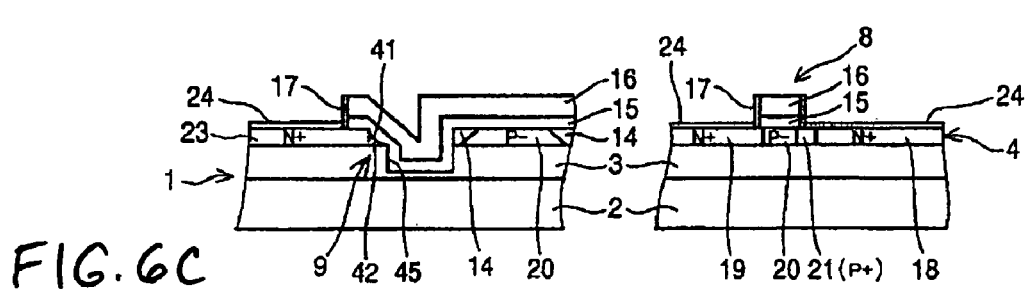
Figure 6D:
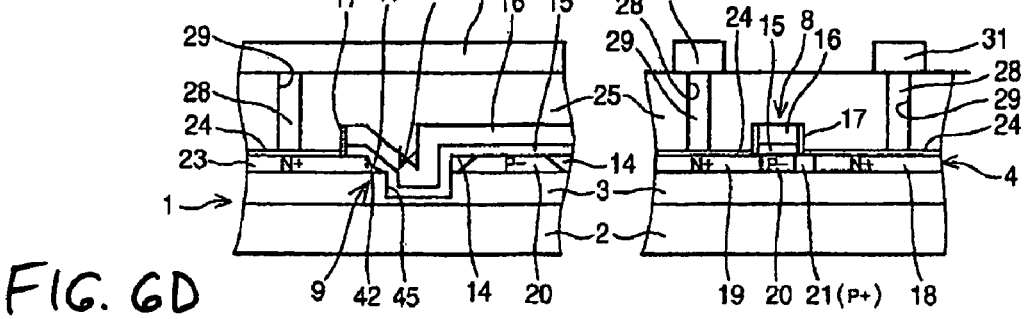
Figure 7:
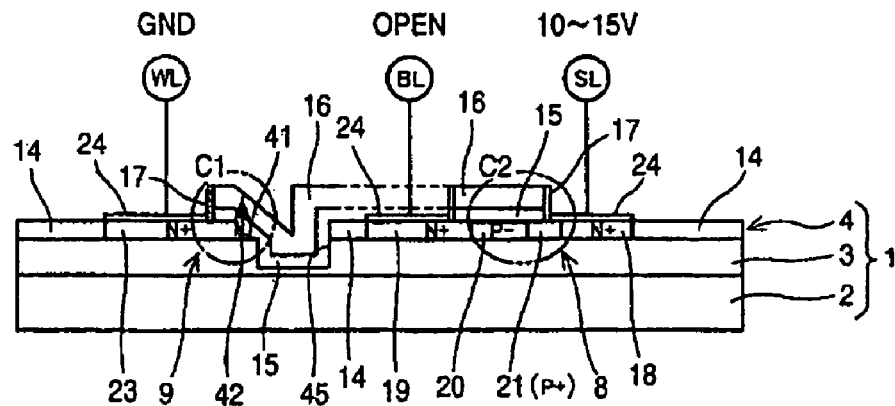
FIG. 7 is a cross-sectional view illustrating an exemplary erase operation of a memory element according to the first exemplary embodiment.
Figure 8:
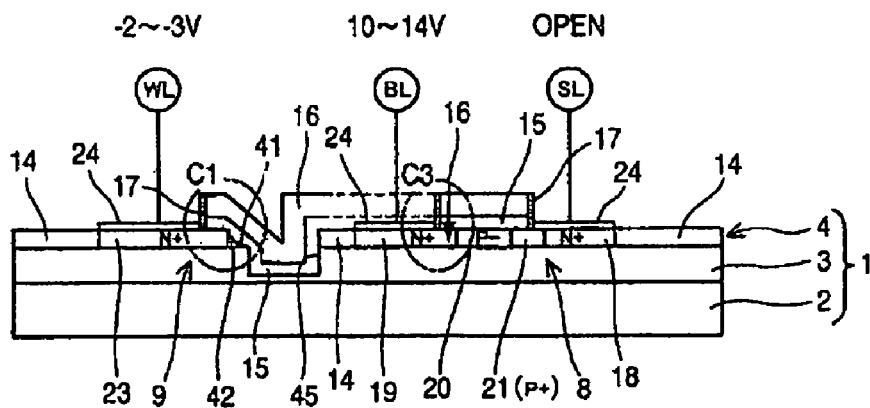
FIG. 8 is a cross-sectional view illustrating an exemplary write operation of a memory element according to the first exemplary embodiment.

FIG. 1 is a plan view of a semiconductor memory device according to Embodiment 1, FIG. 2 is a sectional view taken along line A-A of FIG. 1, FIG. 3 is a sectional view taken along line B-B of FIG. 1, FIG. 4 is an explanatory view illustrating a setting state of regions on a SOI layer according to Embodiment 1, FIGS. 5 and 6 are explanatory views illustrating a manufacturing method of a semiconductor memory device according to Embodiment 1, FIG. 7 is an explanatory view illustrating an erase operation of a memory element according to Embodiment 1, and FIG. 8 is an explanatory view illustrating a write operation of a memory element according to Embodiment 1.

FIG. 1 shows a substrate with first and second interlayer insulating films removed.

In FIGS. 1, 2 and 3, reference numeral 1 denotes a semiconductor substrate which has a SOI structure. The semiconductor substrate 1 includes a support substrate 2 made of silicon (Si), a buried oxide film 3 which is formed on the support substrate 2 and is made of silicon oxide ($SiO_2$) with a thickness of 1500 Å (angstrom) or so, and a SOI layer 4 which is formed on the buried oxide film 3 and is made of single crystal silicon with a thickness of 500 Å or so.

In this embodiment, as shown in FIG. 4, the SOI layer 4 of the semiconductor substrate 1 includes a capacitor forming region 5 in which a MOS capacitor 9 (which will be described later) is to be formed, a transistor forming region 6 in which a MOSFET is to be formed, and an element isolation region 7 surrounding the capacitor forming region 5 and the transistor forming region 6 and in which an element isolation layer 14 (which will be described later) for isolating a capacitor forming region 5 from an adjacent transistor forming region 6 is to be formed.

In this embodiment, nMOS elements 8 as a kind of MOSFET are formed in the transistor forming region 6, MOS capacitors 9 are formed in the capacitor forming region 5. In addition, the nMOS elements 8 formed in one transistor forming region 6 are combined in series with the MOS capacitors 9 formed in one adjacent capacitor forming region 5. In addition, one memory element 11 functioning as an electrically programmable 1 bit nonvolatile memory is formed in a memory element forming region 10 indicated by a thick chain double-dashed line in FIGS. 1 and 4.

In addition, in this embodiment, a plurality of sets of memory element forming regions 10, each set including four memory element forming regions 10 ate arranged on the semiconductor substrate 1, two of which are linearly symmetrically arranged around a boundary line between two adjacent capacitor forming regions 5 connected to each other (in a vertical direction in FIG. 1), and the remaining two of which are linearly symmetrically arranged around a boundary line between two adjacent transistor forming regions 6 connected to each other (in a horizontal direction in FIG. 1).

Reference numeral 14 denotes an element isolation layer on the SOI layer 4 of the element isolation region 7 formed as an insulating layer made of a insulating material such as silicon oxide or the like and extending to the buried oxide film 3. The element isolation layer 14 electrically isolates adjacent capacitor forming regions 5 of the SOI layer 4 from each other and electrically isolates the capacitor forming region 5 from the transistor forming region 6.

Reference numeral 15 denotes a gate insulating film having thickness of 50 to 150 Å, which is made of an insulating material such as silicon oxide or the like and is used in common by the nMOS element 8 and the MOS capacitor 9 formed on the SOI layer 4, as shown in FIGS. 2 and 3.

Reference numeral 16 denotes a floating gate electrode made of polysilicon or the like, which overlaps the SOI layer 4 of the capacitor forming region 5 and the transistor forming region 6, with a gate insulating film 15 interposed between the floating gate electrode and the SOI layer 4. As shown in FIG. 1, the floating gate electrode 16 bisects the transistor forming region 6 and is arranged to extend to cover a portion of the transistor forming region 6 on the capacitor forming region 5. The floating gate electrode 16 functions as a gate electrode used in common by the nMOS element 8 and the MOS capacitor 9. An insulating film 17 made of an insulating material such as silicon oxide or the like is formed on a lateral side of the floating gate electrode 16. The floating gate electrode 16 is in a floating state in which it is electrically isolated from the outside by the gate insulating film 15, the insulating film 17, or the like.

A source (N+) 18 and a drain (N+) 19 diffused with N-type impurities, such as arsenic (As) or the like, of relatively high density (for example, more than $1 \times 10^{18}$ ions/$cm^3$) are formed in both sides of the floating gate electrode 16 of the SOI layer 4 of the transistor forming region 6. A doped region (P−) of the SO layer 4, which is diffused with P-type impurities, such as boron (B) or the like, of relatively low density under the floating gate electrode 16 interposed between the source 18 and the drain 19, functions as a channel region 20 of the nMOS element 8.

Reference numeral 21 denotes a P+ diffusing layer which is a heavily-doped diffusing layer which is formed to make direct contact with the channel region 20 by diffusing impurities, which have the same conductivity (P type in this embodiment) as the impurities diffused into the channel region 20, into the source layer 18 near an interface between the source layer 18 and the channel region 20 at relatively high density (for example, more than $1 \times 10^{20}$ ions/$cm^3$) by a length of ⅕ or so of a gate width (referring to a length of the SOI layer 4 in a direction perpendicular to a gate length represented by Lg in FIG. 2) indicated by E in FIG. 1 along the interface.

Reference numeral 23 denotes a capacitor electrode which is a diffusing layer (N+ in this embodiment) formed by diffusing impurities, which have the same conductivity (N type in this embodiment) as the source layer 18, into the SOI layer 4 of the capacitor forming region 5 at relatively high density (for example, more than $1 \times 10^8$ ions/cm$^3$), as shown in FIG. 3. A portion of the capacitor electrode 23 at a side of the nMOS element 8 is arranged to oppose an end portion of the floating gate electrode 16 with the gate insulating film 15 interposed therebetween.

Reference numeral 24 denotes a silicide layer which is a conductive layer made of a compound produced by combining a silicidation material (such as cobalt (Co) or the like) with silicon through an annealing process. The silicide layer 24 is formed on the capacitor electrode 23, the drain layer 19, the source layer 18, and the P+ diffusing layer 21.

The silicide layer 24 covering the source 18 and the P+ diffusing layer 21 electrically connects the source 18 to the P+ diffusing layer 21, and the source 18 is connected to the doped channel region 20 diffused with the impurities having the same conductivity as the P+ diffusing layer 21 through the silicide layer 24 and the P+ diffusing layer 21.

Reference numeral 25 denotes a first interlayer insulating film which is an insulating film made of an insulating material (such as silicon oxide or the like) covering the nMOS element 8 and the MOS capacitor 9 formed on the SOI layer 4.

Reference numeral 26 denotes a second interlayer insulating film which is an insulating film made of an insulating material (such as silicon oxide or the like) covering the first interlayer insulating film 25 formed on the SOI layer 4.

Reference numeral 28 denotes a contact plug which is a plug formed by filling a contact hole 29, which is formed as a through hole extending to the silicide layer 24 on the source 18 of the nMOS element 8, the drain 19 of the nMOS element 8, and the capacitor electrode 23 of the MOS capacitor 9 through the first interlayer insulating film 25, with a conductive material such as tungsten (W) or the like.

The contact plug 28, connected to the source layer 18 and the P+ diffusing layer 21 of the nMOS element 8 through the silicide layer 24, is electrically connected to a source line (SL) 31 formed on the first interlayer insulating film 25, as shown in FIG. 2. The contact plug 28 connected to the drain 19 of the nMOS element 8 through the silicide layer 24 is electrically connected to intermediate wiring 32 formed on the first interlayer insulating film 25. The contact plug 28 connected to the capacitor electrode 23 of the MOS capacitor 9 through the silicide layer 24 is electrically connected to a word line (WL) 33 formed on the first interlayer insulating film 25, as shown in FIG. 3.

Reference numeral 35 denotes a via plug which is a plug formed by filling a via hole 36, which is formed as a through hole extending to the intermediate wiring 32 formed on the first interlayer insulating film 25 through the second interlayer insulating film 26, with a conductive material such as tungsten (W) or the like.

The via plug 35 connected to the intermediate wiring 32 is electrically connected to the bit line (BL) 37 formed on the second interlayer insulating film 26. Thus, the drain layer 19 of the nMOS element 8 is electrically connected to the bit line 37.

In this embodiment, the source line 31, the intermediate wiring 32, the word line 33, and the bit line 37 are made of a wiring material such as aluminum (Al), copper (Cu) or the like having good conductivity.

In this embodiment, each memory element 11 is arranged linearly symmetrically to the memory element 11 formed on the adjacent memory element forming region 10 by aligning their capacitor electrodes 23, the source 18, or the drain 19. The contact plugs 28 connected to the source line 31, the intermediate wiring 32, the word line 33 and the bit line 37 are arranged on boundaries of adjacent capacitor electrode 23, and the source 18 and the drain 19 and are used in common between adjacent memory elements 11.

As shown in FIGS. 1 and 3, a projection 42 having a concave surface 41 extending to the buried oxide film 3 is formed in the periphery of the capacitor electrode 23. As shown in FIG. 3, a leading edge of the projection 42 at an end portion of the nMOS element 8 faces an end portion of the floating gate electrode 16 and is separated from the floating gate electrode 16 by the gate insulating film 15.

For example, when the element isolation layer 14 is formed by oxidizing the SOI layer 4 by means of a LOCOS method using a silicon nitride film 54 on a pad oxide film 53 (see FIG. 5A-5E) as a mask, the concave surface 41 of the projection 42 may be formed by etching the inclined surface 43 (see FIG. 5A-5E) extending to the buried oxide film 3 formed on the SOI layer 4 by means of an isotropic etching process with selectivity to silicon using a triangle-sectioned bird's beak formed when a lead edge of the element isolation layer 14 penetrates into a boundary between the silicon nitride film 54 of the capacitor forming region 5 and the SOI layer 4.

Reference numeral 45 denotes a capacitor groove which is a groove formed around the capacitor electrode 23 and whose bottom is formed in the buried oxide film 3. The capacitor groove 45 is formed by removing the buried oxide film 3 near the projection 42 and the element isolation layer 14. The depth of the capacitor groove 45 is deeper than the thickness of the gate insulating film 15.

In FIGS. 5A-5E and 6A-6D, reference numeral 51 denotes a resist mask which is a mask member formed by exposing and developing a positive or negative resist applied in the semiconductor substrate 1 by means of a photolithographic process and which functions as a mask for etching or ion implantation in this embodiment.

Hereinafter, a method of manufacturing the semiconductor memory device according to this embodiment will be described with reference to FIGS. 5A-5E and 6A-6D.

In FIGS. 5A-5E and 6A-6D, the right side in each process shows a method of manufacturing the nMOS element 8 in the right side of FIG. 2, showing the same section as FIG. 2, and the left side in each process shows a method of manufacturing the MOS capacitor 9 in the right side of FIG. 3, showing the same section as FIG. 3.

FIG. 5A: The semiconductor substrate 1 is prepared, including the support substrate 2 on which the SOI layer 4 diffused with P-type impurities (P−) of relatively low density through the buried oxide film 3 is laminated. Next, the capacitor forming region 5, the transistor forming region 6, and the element isolation region 7 surrounding these regions 5 and 6 are defined in the SOI layer 4. Next, the pad oxide film 53 is formed at small thickness on the SOI layer 4 by means of thermal oxidation. Next, the silicon nitride film 54 is formed at a relatively large thickness on the pad oxide film 53 by means of a CVD (Chemical Vapor Deposition) method.

FIG. 5B: The resist mask 51 (not shown) for covering the capacitor forming region 5 and the transistor forming region 6 and for exposing the silicon nitride film 54 of the element isolation region 7 is formed on the silicon nitride film 54. Next, using the resist mask 51 as a mask, the silicon nitride film 54 and the pad oxide film 53 are etched by means of an anisotropic etching method, thereby exposing the SOI layer 4 of the element isolation region 7.

FIG. 5C: The resist mask 51 formed in the process P2 is removed. Then, the element isolation layer 14 extending to the buried oxide film 3 is formed between the transistor forming region 6 and the capacitor forming region 5 by oxidizing the SOI layer 4 by means of a LOCOS method using the exposed silicon nitride film 54 as a mask.

At this time, a triangle-sectioned bird's beak is formed when a leading edge of the element isolation layer 14 penetrates into a boundary between the silicon nitride film 54 of the capacitor forming region 5 and the SOI layer 4, and, accordingly, the projection 42 having the inclined surface 43 expanding to the buried oxide film 3 is formed in the periphery of the SOI layer 4.

FIG. 5D: The silicon nitride film 54 and the pad oxide film 53 are removed by means of a wet etching method using hot phosphoric acid (Hot-$H_3PO_4$) and hydro fluoric acid (HF), thereby exposing the SOI layer 4.

Next, the resist mask 51 having an opening to expose the projection 42 formed in the periphery of the SOI layer 4 of the capacitor forming region 5 and the element isolation layer 14 of a region adjacent to the projection 42 is formed on the SOI layer 4 and the element isolation layer 14 by means of a photolithographic method. Next, using the resist mask 51 as a mask, the exposed element isolation layer 14 is etched by means of an isotropic etching method with selectivity to silicon (=etching rate of silicon/etching rate of silicon oxide, 3 to 4 or so in this embodiment), thereby exposing the buried oxide film 3.

At this time, in this embodiment, since the isotropic etching has the selectivity to silicon, the inclined surface 43 of the projection 42 made of silicon is also etched during removal of the bird's beak on the projection 42, thereby forming the inclined concave surface 41 extending to the buried oxide film 3 in the projection 42. An angle between the bottom of a leading edge of the projection and the concave surface 41 (called the leading edge angle) becomes smaller than the leading edge angle of the inclined surface 43.

Such isotropic etching may be performed using a microwave plasma ashing apparatus (for example, MAS-8820 available from Canon Inc.) as an etching apparatus. The gas used may be a mixture of oxygen ($O_2$) of 50 sccm and carbon tetrafluoride ($CF_4$) of 50 sccm at a pressure of 0.6 Torr. The RF (Radio Frequency) power may be 800 W, the temperature may be 60° C., the etching time may be 15 seconds, and the selectivity to silicon may be 2 to 4.

Alternatively, the isotropic etching may be performed using, a dry etching apparatus (for example, CDE-80N available from Shibaura Seiasku-sho) as an etching apparatus. The gas used may be a mixture of oxygen of 150 sccm and carbon tetrafluoride of 150 sccm, the pressure may be 30 Pa, the RF power may be 400 W, the temperature may be 20° C., the etching time may be 30 seconds, and the selectivity to silicon may be 8 to 10.

FIG. 5E: The resist mask 51 formed in the step shown in FIG. 5D is removed, and a resist mask 51 having an opening exposing the buried oxide film 3 in a region adjacent to the leading edge of the projection 42 is formed on the SOI layer 4, the concave surface 41 of the projection 42 formed in the periphery of the SOI layer 4 of the capacitor forming region 5, and the element isolation layer 14. Next, using this resist mask 51 as a mask, the exposed buried oxide film 3 is etched by means of an anisotropic etching method, thereby forming the capacitor groove 45 having its bottom in the buried oxide film 3.

FIG. 6A: The resist mask 51 formed in the step shown in FIG. 5E is removed, and a silicon oxide film 15a made of silicon oxide for forming the gate insulating film 15 is formed on the capacitor forming region 5, the SOI layer 4 of the transistor forming region 6, and the element isolation layer 14, and in the inner side of the capacitor groove 45 by means of a thermal oxidation method or a CVD method. Next, a polysilicon film 16a for forming the floating gate electrode film 16 is formed on the silicon oxide film 15a by means of a CVD method.

FIG. 6B: A resist mask 51 (not shown) is formed by means of a photolithography method to cover a region in which the floating gate electrode 16 is to be formed on the polysilicon film 16a. Next, the exposed polysilicon film 16a and silicon oxide film 15a are etched to expose the SOI layer 4 and the buried oxide film 3 of the bottom of the capacitor groove 45 by means of an anisotropic etching method or the like, thereby bisecting the SOI layer 4 in the transistor forming region 6 and extending the SOI layer 4 to the projection 42 at the end portion of the transistor forming region 6 of the SOI layer 4 of the capacitor forming region 5. At the same time, the floating gate electrode 16 facing the SOI layer 4 and the leading edge of the projection 42 through the gate insulating film 15 is formed. Next, after removing the resist mask 51, a silicon oxide film is formed on the floating gate electrode 16, the SOI layer 4 and so on by means of a thermal oxidation method or a CVD method. Next, the entire surface of the SOI layer 4 is etched by means of an anisotropic etching method, thereby exposing the top side of the floating gate electrode 16, the top side of the SOI layer 4, and the concave surface 41 of the projection 42 except for the bottom of the floating gate electrode 16 and forming the insulating film 17 at the lateral side of the floating gate electrode 16.

In addition, a resist mask 51 having an opening to expose the SOI layer 4 of the capacitor forming region 5, the SOI layer 4 of a region in which the drain layer 19 of the nMOS element 8 of the transistor forming region 6 is to be formed, and the SOI layer 4 of a region in which the source layer 18 is to be formed except for a region in which the P+ diffusing layer 21 adjacent to the floating gate electrode 16 is to be formed is formed by means of a photolithography method. Next, using the resist mask 51 as a mask, these SOI layers 4 are heavily doped with N-type impurity ions, thereby forming the source 18 and the drain 19 on the SOI layers 4 at both sides of the floating gate electrode 16 and the capacitor electrode 23 on the SOI layer 4 of the capacitor forming region 5.

Thus, the doped channel region 20 is formed below the floating gate electrode 16 interposed between the source 18 and the drain 19.

FIG. 6C: The resist mask 51 used for injection of N-type impurities is removed, and then, a resist mask 51 (not shown) having an opening to expose a portion adjacent to the floating gate electrode 16 of a region in which the source layer 18 of the nMOS element 8 is to be formed, that is, a portion of the SOI layer 4 at the end portion of the source layer 18 adjacent to the channel region 20 near an interface between the source layer 18 and the channel region 20 is formed on the SOI layer 4 of the transistor forming region 6 by means of a photolithography method. Next, using the resist mask 51 as a mask, the SOI layer 4 is heavily doped with P-type impurity ions, thereby forming the P+ diffusing layer 21 in the source layer 18.

Next, the resist mask 51 is removed. Then, a silicidation material layer is formed on the entire surface, that is, the floating gate electrode 16, the insulating film 17, the source 18 including the P+ diffusing layer 21, the drain 19, the capacitor electrode 23, and the element isolation layer 14, by means of a sputtering method. Next, the silicidation material layer on the source 18 including the P+ diffusing layer 21, the drain 19 and the capacitor electrode 23 is silicidated by means of silicidation treatment including annealing treatment of 500° C., thereby forming the silicide layer 24 covering the diffusing layers. In this case, the silicidation treatment refers to treatment until an unnecessary silicidation material layer is removed after performing the annealing treatment.

Thus, the silicide layer 24 is formed on the source 18 and the P+ diff using layer 21 and the source 18 is electrically connected to the P+ diffusing layer 21.

FIG. 6D: A thick silicon oxide film is formed on the SOI layer 4 including the nMOS element 8, the MOS capacitor 9, and the element isolation layer 14 as formed above by means of a CVD method. Then, the first interlayer insulating film 25 is formed by planarizing the top side of the silicon oxide film.

After forming the first interlayer insulating film 25, a resist mask 51 (not shown) having an opening to expose the first interlayer insulating film 25 of a forming region of the contact hole 29 on the source 18 and drain 19 of the nMOS element 8 and the capacitor electrode 23 of the MOS capacitor 9 is formed on the first interlayer insulating film 25 by means of a photolithography method. Next, using the resist mask 51 as a mask, the contact hole 29 extending to the silicide layer 24 on the source 18, the drain 19 and the capacitor electrode 23 through the first interlayer insulating film 25 is formed by means of an anisotropic etching method.

Next, the resist mask 51 is removed, and the contact plug 28 is formed by filling the contact hole 29 with a conductive material by means of a sputtering method or the like and the top side of the first interlayer insulating film 25 is exposed by planarizing the top side of the contact plug 28.

Next, a wiring layer made of a wiring material is formed on the first interlayer insulating film 25 by means of a sputtering method or the like. Next, the wiring layer is patterned by means of a photolithography method and an etching method, thereby forming the source line (SL) 31 connected to the source layer 18 of the nMOS element 8 through the contact plug 28 and the silicide, layer 24, the intermediate wiring 32 connected to, the drain 19 through the contact plug 28 and the silicide layer 24, and the word line (WL) 33 connected to the capacitor electrode 23 of the MOS capacitor 9 through the contact plug 28 and the silicide layer 24.

Thereafter, in the same way as the process shown in FIG. 6D, the second interlayer insulating film 26 is formed on the first interlayer insulating film 25. Next, the via plug 35 is formed by filling the via hole 36 extending to the intermediate wiring 32 through the second interlayer insulating film 26 with a conductive material. Next, the bit line 37 connected to the drain 19 of the nMOS element 8 through the via plug 35, the intermediate wiring 32, and the contact plug are formed on the second interlayer insulating film 26, thereby completing the semiconductor device having the memory elements 11 according to this embodiment shown in FIGS. 1 to 3.

Electrostatic capacity between the capacitor electrode 23 of the MOS capacitor 9 and the floating gate electrode 16 (referred to as electrostatic capacity C1 of MOS capacitor 9—see FIG. 7), electrostatic capacity between the channel region 20 connected to the source layer 18 of the nMOS element 8 through the silicide layer 24 and the P+ diffusing layer 21, and the floating gate electrode 16 (referred to as electrostatic capacity C2 of the source layer 18—see FIG. 7), and electrostatic capacity between the drain layer 19 of the nMOS element 8 and the floating gate electrode 16 (referred to as electrostatic capacity C3 of the drain layer 19—see FIG. 8) are set to have a relationship of C3<C1<C2.

In this embodiment, for an erase operation for erasing data of the memory elements 11, as shown in FIG. 7, the bit line (BL) 37 connected to the drain layer 19 of the nMOS element 8 of all the memory elements 11 is put in an open state (a state of no electrical connection, or a high impedance state), the word line (WL) 33 connected to the capacitor electrode 23 of the MOS capacitor 9 is grounded (GND: 0V), and a voltage of 10 to 15 V is applied to the source line (SL) 31 connected to the source layer 18 of the nMOS element 8 connected to the channel region 20 through the silicide layer 24 and the P+ diffusing layer 21.

In this case, since the drain 19 of the nMOS element 8 is in an open state, effective electrostatic capacity of the nMOS element 8 is only the electrostatic capacity C2 of the source layer 18, and since the electrostatic capacity C1 of the MOS capacitor 9 and the electrostatic capacity C2 of the nMOS element 8 are set to have the relationship of C1<C2, a voltage applied to the source 18 is mostly across the gate insulating film 15 of the MOS capacitor 9 due to capacitive coupling.

At this time, in this embodiment, an electric field is concentrated on the leading edge of the projection 42 because the leading edge of the projection 42 of the capacitor electrode 23 below the floating gate electrode 16 of the nMOS element 8 has a small leading edge angle and because the leading edge of the projection 42 faces the floating gate electrode 16 through the gate insulating film 15. This increases the electric field across the MOS capacitor 9. Accordingly, FN (Fowler Nordheim) tunnel current (FN current) flows from the capacitor electrode 23 into the floating gate electrode 16 in a floated state, thereby injecting charges (electrons in this embodiment) into the floating gate electrode 16.

Thus, electrons are accumulated in the floating gate electrode 16 in a short time, thereby increasing a threshold voltage of the nMOS element 8. This leads to a high threshold of the memory element 11 in an erase state. In this state, data "1" is written in the element 11. In this embodiment, the erase state corresponds to a state in which data "1" is written in all the memory elements 11.

In this case, although the projection 42 has the inclined surface 43 formed in the source layer 18 of the nMOS element 8, since its leading edge faces the floating gate electrode 16 through the element isolation layer 14 and the gate insulating film 15, there is no electric field concentration and no FN current flowing into the nMOS element 8.

This indicates that it is possible to inject electrons into the floating gate electrode even when capacitive coupling (C1<C2) between the electrostatic capacity C1 of the MOS capacitor 9 and the electrostatic capacity C2 of the source 18 of the nMOS element 8 cannot become large. In addition, this makes it possible to perform the erase operation of the memory element 11 more effectively by increasing a degree of freedom of setting of the electrostatic capacities C1 and C2 of the memory element 11.

In addition, this indicates that it is possible to inject electrons into the floating gate electrode 16 in the erase operation even when the voltage applied to the source 18 is lowered, thereby reducing heat generation of the memory element 11 by lowering the voltage for the erase operation.

In this embodiment, for a write operation to write data "0" in the memory element 11, a memory element 11 in which data is to be written is specified. Then, as shown in FIG. 8, the source line (SL) 31 connected to the source layer 18 of the nMOS element 8 of the memory element 11 connected to the channel region 20 through the silicide layer 24 and the P+ diffusing layer 21 is put in an open state, and a voltage of −2 to −3 V is applied to the word line (WL) 33 connected to the capacitor electrode 23 of the MOS capacitor 9 while a voltage of 10 to 14 V is applied to the bit line (BL) 37 connected to the drain layer 19 of the nMOS element 8.

In this case, since the channel 20 and source 18 of the nMOS element 8 are interconnected through the silicide layer 24 and the P+ diff using layer 21 are in an open state, the effective electrostatic capacity of the nMOS element 8 is only the electrostatic capacity C3 of the drain layer 19. Since the electrostatic capacity C1 of the MOS capacitor 9 and the electrostatic capacity C3 of the nMOS element 8 have the relationship of C1>C3, a voltage is mostly applied between the drain 19 and the floating gate electrode 16 of the nMOS element 8 due to capacitive coupling, thereby flowing FN current therebetween. Thus, charges (electrons in this embodiment) accumulated in the floating gate electrode 16 in the floated state are injected from the floating gate electrode 16 into the drain layer 19, and, accordingly, no charge exists in the floating gate electrode 16, which leads to a decrease in the threshold voltage of the nMOS element 8.

When write data "1" is to be written in a certain memory element 11, the write operation of data "0" in the memory element 11 of the erased state may not be performed.

For a read operation to read data written in the memory element 11, a voltage of 2 to 3 V is applied to the word line (WL) 33 connected to the capacitor electrode 23 of the MOS capacitor 9, and a voltage of 1 V or so is applied to the bit line (BL) 37 connected to the drain layer 19 of the nMOS element 8.

In this case, if the memory element 11 is in an erase state or a state where data "1" is written therein, since the threshold voltage of the nMOS element 8 is increased, no drain current flows into the source line 31 (SL) connected to the source 18 of the nMOS element 8. On the other hand, if the memory element 11 is in a state where data "0" is written therein, since the threshold voltage of the nMOS element 8 is decreased, drain current flows into the source line 31 (SL).

The read operation to read data "1" or data "0" written in the memory element 11 is performed by determining whether or not the drain current is present.

As described above, in this embodiment, in the memory element 11, since the drain 19 or the source 18 connected to the channel region 20 through the silicide layer 24 and the P+ diffusing layer 21 is in the open state in the erase operation or the write operation of data "0" in the memory element 11 there is no application of a high voltage between the source 18 and drain 19 of the nMOS element 8.

In addition, by putting the drain 19 or the source 18 in the open state, it is possible to change the electrostatic capacity of the nMOS element 8 and thus inject or draw electrons into the floating gate electrode 16 using a capacitive coupling. Accordingly, even for the memory element 11 using the nMOS element 8 having a SOI structure with a low source-drain withstanding voltage, it is possible to obtain an electrically programmable nonvolatile memory with high reliability.

As a result, it is possible to load such an electrically programmable nonvolatile memory in a semiconductor memory device having a SOI structure, which results in a smaller size and thickness of the semiconductor memory device.

In addition, in this embodiment, since the concave surface 41 of the projection 42 is formed using the inclined surface 43 formed by the bird's beak formed when the element isolation layer 14 is formed by means of a LOCOS method, it is possible to easily form the concave surface 41 around the capacitor electrode 23 by means of an isotropic etching method with selectivity to silicon.

As described above, in this embodiment, by forming the nMOS element and the MOS capacitor isolated from each other in the element isolation layer on the SOI layer of the semiconductor substrate having the SOI structure, providing the inclined concave surface expanding to the buried oxide film in the periphery of the capacitor electrode of the MOS capacitor, and providing the floating gate electrode extending to the projection of the end portion of the nMOS element of the capacitor electrode from the channel region of MOSFET and facing the channel region and the capacitor electrode with the gate insulating film interposed therebetween, in the erase operation of the memory element to inject charges into the floating gate electrode, irrespective of the source-drain withstanding voltage, using the electric field concentration by the leading edge of the projection having the inclined concave surface extending to the buried oxide film below the floating gate electrode of the capacitor electrode, it is possible to easily inject electrons into the floating gate electrode. Further, even for a semiconductor memory device having a SOI structure with a low source-drain withstanding voltage, it is possible inject charges into the floating gate electrode in a short time, thereby making it possible to form an electrically programmable nonvolatile memory with high reliability.

In addition, by forming the element isolation layer by means of a LOCOS method and forming the concave surface by etching the inclined surface formed by the bird's beak when the element isolation layer is formed, by means of an isotropic etching method with selectivity to silicon, it is possible to easily form the concave surface of the periphery of the capacitor electrode.

In addition, in the process shown in FIG. 5D of this embodiment, although the mixture ratio of 50% oxygen in the gas has been described as the etching conditions for the isotropic etching to form the concave surface, the mixture ratio of oxygen may be properly set within a range of 10% to 90%, the selectivity to silicon may be changed, the flow rate, the pressure, the temperature, and the like of the gas may be adjusted. Any suitable etching conditions may be set to obtain the desired shape of the concave surface and depending on depth, direction, and etching rate of the silicon to be etched.

Figure 9:
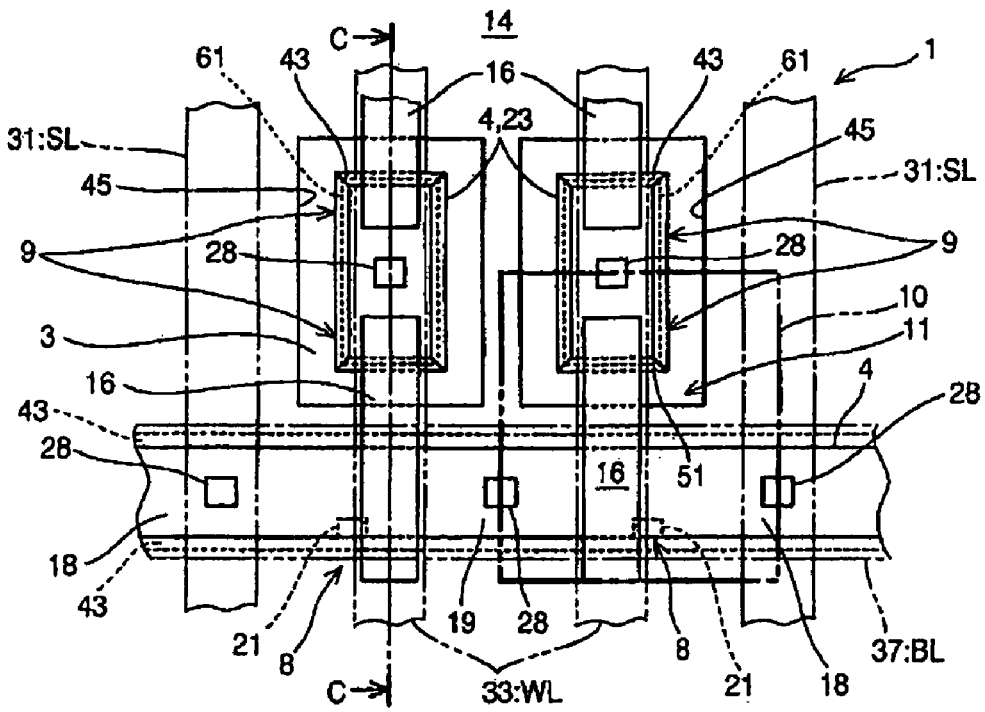
FIG. 9 is a plan view of a second exemplary embodiment of a semiconductor memory device according to the present invention.
Figure 10:
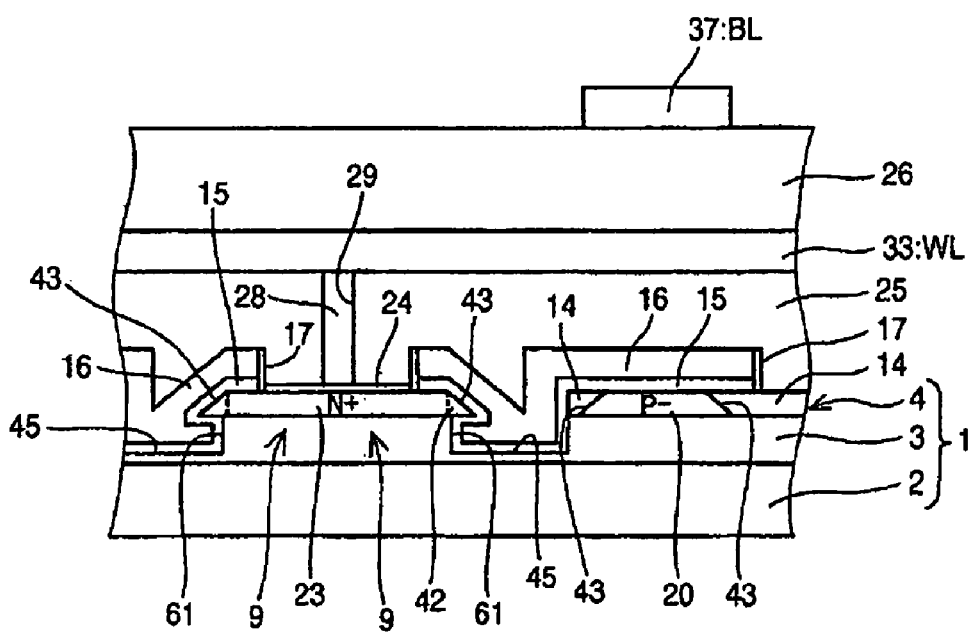
FIG. 10 is a cross-sectional view of a MOS capacitor according to the second exemplary embodiment.

FIG. 9 is a plan view of a semiconductor memory device according to Embodiment 2, FIG. 10 is a sectional view of a MOS capacitor according to Embodiment 2, and FIGS. 11 and 12 are explanatory views illustrating a manufacturing method of a semiconductor memory device according to Embodiment 2.

FIG. 10 shows a section taken along line C-C of FIG. 9. In Embodiment 2, the same components as Embodiment 1 are denoted by the same reference numerals.

In FIGS. 9 and 10, reference numeral 61 denotes a lower undercut portion which is formed by removing the buried oxide film 3 below the projection 42 toward the center of the capacitor electrode 23 such that the bottom of the projection 42 is almost completely exposed.

In addition, in this embodiment, the inclined surface 43 extending to the buried oxide film 3 formed by the bird's beak is formed in the periphery of the capacitor electrode 23.

Since the projection 42 having the inclined surface 43 has an acute-angled leading edge and faces the floating gate electrode 16 through the gate insulating film 15, it is possible to easily concentrate an electric field on the MOS capacitor 9 during an erase operation.

Hereinafter, a method of manufacturing the semiconductor memory device of this embodiment will be described as illustrated in FIGS. 11A-11D and 12A-12D.

In FIGS. 11A-11D and 12A-12D, the right side in each process shows a method of manufacturing the nMOS element 8 shown in the right side of FIG. 2, showing the same section as FIG. 2, and the left side in each process shows a method of manufacturing the MOS capacitor 9 in the right side of FIG. 10, showing the same section as FIG. 10.

Figure 11A:
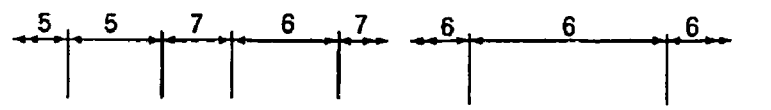
FIGS. 11A-11D are cross-sectional views illustrating an exemplary manufacturing method for making a semiconductor memory device according to the second exemplary embodiment.
Figure 11B:
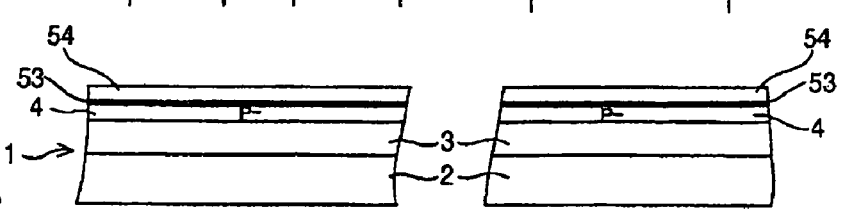
Figure 11C:
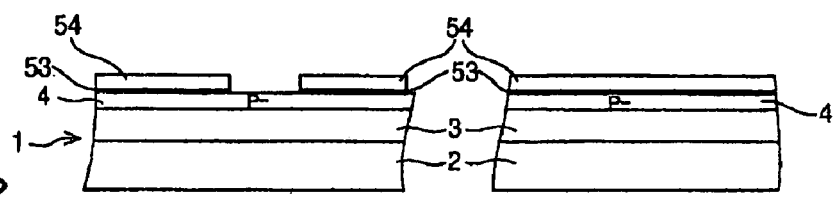

In this embodiment, the processes shown in FIG. 11A to FIG. 11C are the same as the processes shown in FIG. 5A to FIG. 5C in Embodiment 1.

Figure 11D:
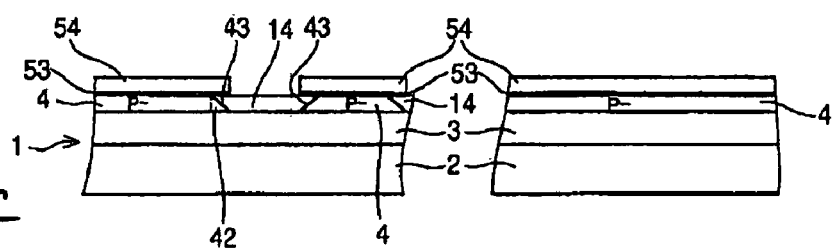

FIG. 11D: First, like the process shown in FIG. 5D, the silicon nitride film 54 and the pad oxide film 53 are removed to expose the SOI layer 4.

Next, the resist mask 51 having an opening exposing the projection 42 formed in the periphery of the SOI layer 4 of the capacitor forming region 5 and the element isolation layer 14 of a region adjacent to the projection 42 is formed on the SOI layer 4 and the element isolation layer 14 by means of a photolithographic method. Next, using the resist mask 51 as a mask, the element isolation layer 14 and the buried oxide film 3 including the bottom of the projection 42 are etched by means of a wet etching method to selectively etch the silicon oxide using hydrofluoric acid or the like. Next, the capacitor groove 45 is formed. The capacitor groove has its bottom in the buried oxide film 3 and includes a lower undercut portion 61 formed by removing the buried oxide film 3 below the projection 42. After the etching operation, the memory device is washed with water and is dried.

By this process shown in FIG. 11D, almost all of the projection 42 is exposed to the periphery of the SOI layer 4 of the capacitor forming region 5 and the projection 42 extends above the capacitor groove 45.

When the wet etching is performed at 25° C. using 5% aqueous solution of hydrofluoric acid, an etching rate of about 30 nm/min for silicon oxide can be obtained.

Alternatively, when the wet etching is performed at 23.5° C. using a solution of buffered hydrofluoric acid produced by mixing ammonium hydrogen fluoride ($NH_4HF_2$) of 15% and ammonium fluoride ($NH_4F$) of 25%, an etching rate of about 55 nm/min for silicon oxide can be obtained.

Figure 12A:
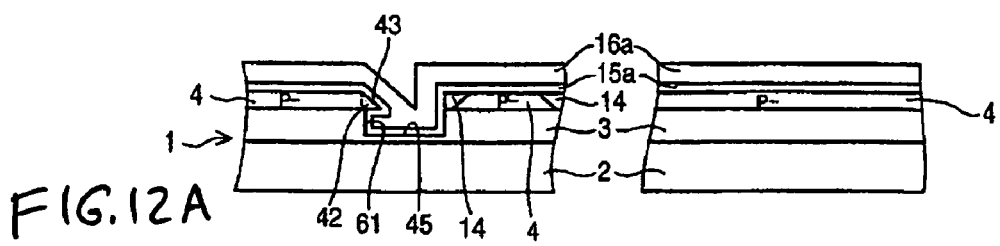
FIGS. 12A-12D are cross-sectional views illustrating an exemplary manufacturing method for making a semiconductor memory device according to the second exemplary embodiment.

FIG. 12A: The resist mask 51 formed in the process shown in FIG. 11D is removed, and the silicon oxide film 15a made of silicon oxide for forming the gate insulating film 15 is formed on the SOI layer 4 and the element isolation layer 14 of the capacitor forming region 5 and the transistor forming region 6 and in the capacitor groove 45 and the inner side of the lower undercut portion 61 by means of a thermal oxidation method or a CVD method. Next, the polysilicon film 16a for forming the floating gate electrode 16 is formed on the silicon oxide film 15a by means of a CVD method.

Figure 12B:
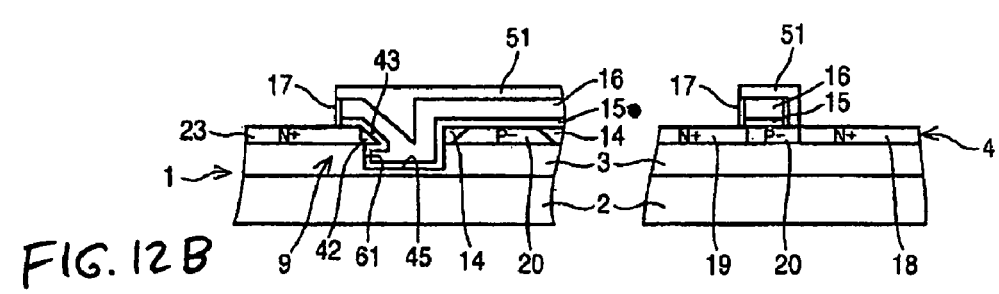

FIG. 12B: A resist mask 51 (not shown) is formed on the polysilicon film 16a by means of a photolithography method to cover a region in which the floating, gate electrode 16 will be formed. Next, the exposed polysilicon film 16a and silicon oxide film 15a are etched to expose the SOI layer 4 and the buried oxide film 3 of the bottom of the capacitor groove 45 by means of an anisotropic etching method or the like, thereby bisecting the SOI layer 4 in the transistor forming region 6 and extending the SOI layer 4 to the projection 42 at the end portion of the transistor forming region 6 of the SOI layer 4 of the capacitor forming region 5. At the same time, the floating gate electrode 16 facing the SOI layer 4 and the leading edge of the projection 42 through the gate insulating film 15 is formed. Next, the resist mask 51 is removed.

Figure 13:
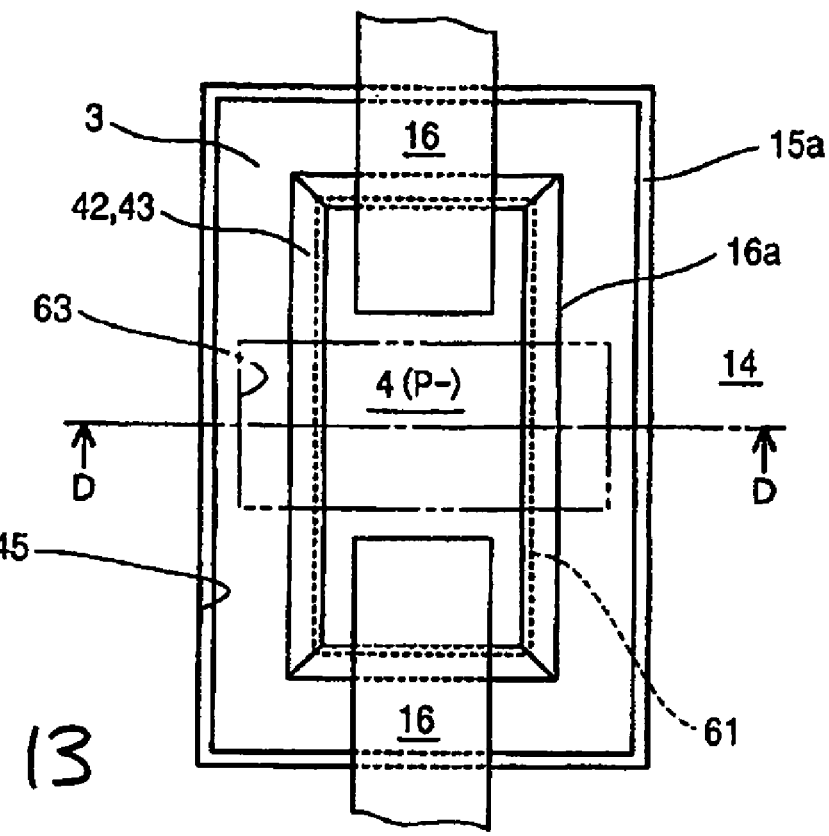
FIG. 13 is a plan view showing adjacent capacitor forming regions and capacitor grooves according to the second exemplary embodiment.
Figure 14:
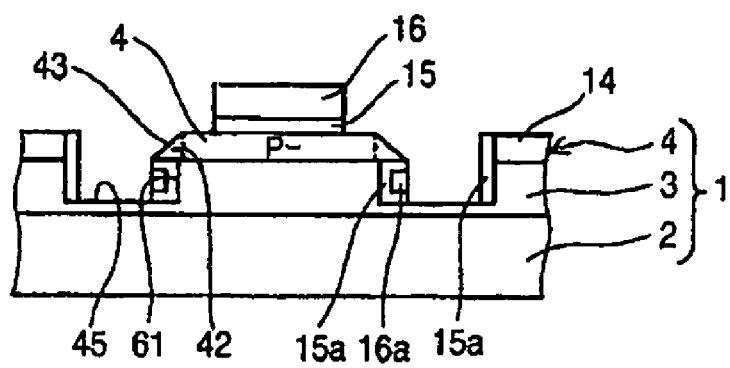
FIG. 14 is a cross-sectional view taken along line D-D of FIG. 13.

At this time, in this embodiment, since the lower undercut portion 61 is formed beneath the projection 42, as shown in FIGS. 13 and 14, the polysilicon film 16a remains in the lower undercut portion 61 below the projection 42 formed in the periphery of the SOI layer 4 of the capacitor forming region 5.

Since the polysilicon film 16a in the lower undercut portion 61 is connected to the floating gate electrode 16 formed above, as shown in FIG. 12B, the floating gate electrodes 16 (see FIG. 9) formed in two adjacent capacitor electrodes 23 of two memory elements 11 which are linearly symmetrically arranged are electrically interconnected by the polysilicon film 16a remaining in the lower undercut portion 61, thereby making it impossible to perform a write operation and the like.

Accordingly, in this embodiment, a cutting process for the polysilicon film 16a is performed as follows in order to cut out the polysilicon film 16a of the lower undercut portion 61 interconnecting the floating gate electrodes 16.

After forming the floating gate electrode 16, a resist mask 51 (not shown) having an opening 63 (indicated by a chain double-dashed line in FIG. 13) to expose the SOI layer 4 of the capacitor forming region 5 for forming the adjacent capacitor electrodes 23 between the opposing floating gate electrodes 16, the inclined surface 43 of the projection 42 in the SOI layer 4, and the buried oxide film 3 adjacent to the projection 42 is formed on the exposed buried oxide film, SOI layer 4 and element isolation layer 14 by means of a photolithography method. Next, using the resist mask 51 as a mask, the polysilicon film 16a remaining in the lower undercut portion 61 is etched by means of an isotropic etching method to cut the polysilicon film 16a interconnecting the opposing floating gate electrodes 16, and then, the resist mask 51 is removed.

Such isotropic etching may be performed using Centura-mxp (available from Applied Materials, Inc. (AMAT)) as an etching apparatus under etching conditions such as a mixture of hydrogen bromide (HBr) gas of 14 sccm and sulfur hexafluoride ($SF_6$) gas of 20 sccm, at a pressure of 20 mTorr, with an RF power of 300 W, an electromagnetic force of 45 Gauss, a wall temperature of 45° C., and a cathode electrode temperature of 40° C.

After the cutting process, a silicon oxide film is formed on the floating gate electrode 16, the SOI layer 4 and so on by means of a thermal oxidation method or a CVD method. Next, the entire surface of the SOI layer 4 is etched by means of an isotropic etching method, thereby exposing the top side of the floating gate electrode 16, the top side of the SOI layer 4, and the inclined surface 43 of the projection 42 except for the bottom of the floating gate electrode 16. Next, the insulating film 17 is formed on a lateral side of the floating gate electrode 16, a cut surface of the polysilicon film 16a in the bottom of the projection 42 and the lower undercut portion 61, and a lateral side of the polysilicon film 16a except for the cut surface.

Next, in the same way as the process FIG. 6B in Embodiment 1, these SOI layers 4 are heavily doped with N-type impurity ions, thereby forming the source layer 18 and the drain layer 19 on the SOI layers 4 at both sides of the floating gate electrode 16 and the capacitor electrode 23 on the SOI layer 4 of the capacitor forming region 5.

Thus, the doped channel region 20 is formed below the floating gate electrode 16 interposed between the source 18 and the drain 19.

Figure 12C:
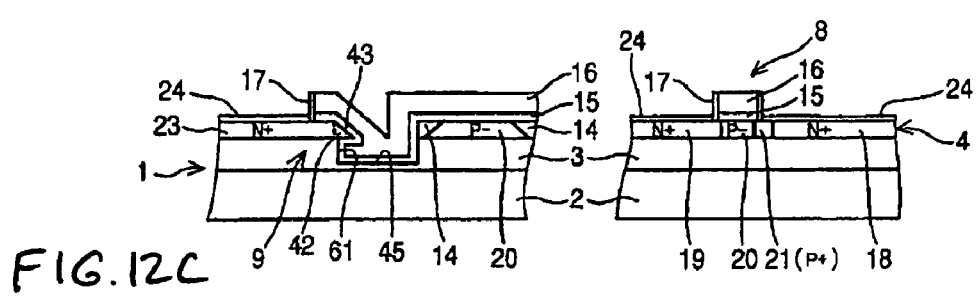
Figure 12D:
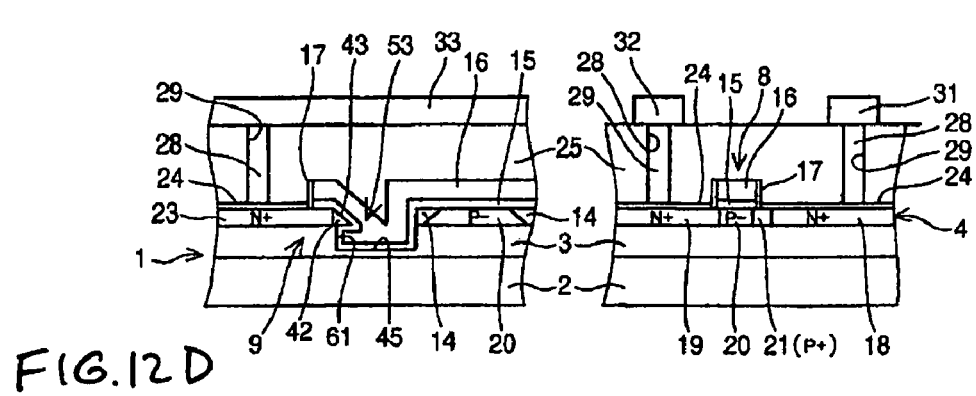

In this embodiment, the subsequent processes shown in FIG. 12C and FIG. 12D are the same as the processes shown in FIG. 6C and FIG. 6D.

In the process shown in FIG. 12D, when the silicidation material layer is formed on the entire surface, although the silicidation material layer is formed in the cut surface and lateral side of the polysilicon film 16a in the lower undercut portion 61 and the, bottom of the projection 42, since these portions are covered with the insulating film 17, the silicide layer 24 is not formed in these portions and there is no electrical connection between the opposing floating gate electrodes 16 formed in two capacitor electrodes 23, respectively.

An erase operation, a write operation, and a read operation of the memory clement 11 including the capacitor electrode 23 having a projection 42 with an inclined surface 43 are the same as those for Embodiment 1.

For the erase operation, when a voltage applied to the source layer 18 is mostly across the gate insulating film 15 of the MOS capacitor 9 by the above-described capacitive coupling, since the projection 42 having the inclined surface 43 of this embodiment is provided with the lower undercut portion 61, the whole of projection 42 extends above the capacitor groove 45, thereby increasing the exposure area, and the leading edge of the projection 42 faces the floating gate electrode 16 through the gate insulating film 15, it is possible to further concentrate an electric field on the leading edge stably, and it is possible to more easily flow FN current from the capacitor electrode 23 into the floating gate electrode 16, thereby making it possible to inject charges (electrons in this embodiment) into the floating gate electrode 16 with higher reliability.

In addition, in this embodiment, since the inclined surface 43 of the projection 42 is formed by the LOCOS method using the bird's beak formed when the element isolation layer 14 is formed, it is possible to easily form the inclined surface 43 around the capacitor electrode 23 without adding separate processes.

As described above, in this embodiment, by concentrating an electric field on the leading edge of the projection having the inclined surface extending to the buried oxide film below the floating gate electrode of the capacitor electrode, the same effects as Embodiment 1 can be obtained. At the same time, by providing the lower undercut portion of the buried oxide film below the projection formed in the periphery of the capacitor electrode of the MOS capacitor, it is possible to locate the leading edge of the projection towards the floating gate electrode through the gate insulating film, with the whole of the projection extending above the capacitor groove to increase the exposure area. Thus, it is possible to further concentrate an electric field on the leading edge of the projection stably, thereby making it possible to inject charges into the floating gate electrode 16 with higher reliability.

In addition, in forming opposing floating gate electrodes in two adjacent capacitor electrodes of memory elements which are linearly symmetrically arranged, by cutting the polysilicon film remaining in the lower undercut portion between the opposing floating gate electrodes by means of an isotropic etching method, it is possible to prevent the opposing floating gate electrodes from being electrically interconnected by the polysilicon film remaining in the lower undercut portion, thereby making it possible to stably perform various operations in the semiconductor memory device.

Although it has been illustrated in above embodiments that the inclined surface 43 of the projection 42 is formed by the bird's beak formed by means of the LOCOS method, the projection 42 may be formed by means of a STI method.

Hereinafter, a method of forming the projection 42 by means of the STI method will be described according to the following processes SB1 to SB3.

Process SB1: The semiconductor substrate 1 set in the same way as the process shown in FIG. 5A is prepared. Next, the pad oxide film 53 and the silicon nitride film 54 as a stopper nitride film are formed in the same way as the process shown in FIG. 5A.

Process SB2: In the same way as the process shown in FIG. 5B, the resist mask 51 to expose the silicon nitride film 54 of the element isolation region 7 is formed. Next, using the resist mask 51 as a mask, the silicon nitride film 54, the pad oxide film 53 and the SOI layer 4 are etched by means of an isotropic etching method, thereby exposing the buried oxide film 3 and forming a separation groove extending to the buried oxide film 3.

At this time, the top side of the SOI layer 4 is etched by means of an isotropic etching method, thereby forming the inclined surface 43 configuring a lateral side of the separation groove, and the projection 42 having the inclined surface 43 is formed in an end portion of the SOI layer 4.

Process SB3: The resist mask 51 is removed, and silicon oxide is deposited on the silicon nitride film 54 and in the separation groove by means of a CVD method, thereby forming a silicon oxide film filling the separation groove thicker than at least the SOI layer 4.

Next, the deposited silicon oxide film, the silicon nitride film 54 and the pad oxide film 53 are removed by means of a CMP (Chemical Mechanical Polishing) method or any suitable mechanical polishing method, thereby exposing the SOI layer 4, and then the element isolation layer 14 is formed in the element isolation region 7 between the transistor forming region 6 and the capacitor forming region 5.

This state is the same as the state where the silicon nitride film 54 and the pad oxide film 53 are removed to expose the SOI layer 4 by means of the wet etching method in the processes shown in FIG. 5D and FIG. 11D.

The subsequent processes are the same as the processes subsequent to the processes shown in FIG. 5D and FIG. 11D.

Even in this manner, it is possible to form the same memory element 11 as in the LOCOS method.

Although it has been illustrated in the above embodiments that two memory elements are linearly symmetrically arranged by abutting the capacitor electrodes, the number of memory elements in which the MOSFET and the MOS capacitor formed on the semiconductor substrate having the SOI structure are connected to one floating gate electrode may also be one or three or more.

In addition, although it has been illustrated in the above embodiments that the MOSFET is an nMOS element, the MOSFET may be a pMOS element and impurities of the capacitor electrode or the heavily-doped diffusing layer may have the opposite conductivity type.

Following from the above description and invention summaries, it should be apparent to those of ordinary skill in the art that, while the methods and apparatuses described herein constitute exemplary embodiments of the present invention, the invention is not limited to these precise embodiments and changes may be made to such embodiments without departing from the scope of the invention as defined by the claims. Additionally, it is to be understood that the invention is defined by the claims and it is not intended that any limitation or element describing the exemplary embodiments set forth herein is to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, as the invention is defined by solely by the claims and since inherent and/or unforeseen advantages of the present invention may exist even though they may not have been explicitly discussed herein.

What is claimed is:

1. A semiconductor memory device including a memory element including a MOSFET and a MOS capacitor comprising:
   a semiconductor substrate including a support substrate, an insulating layer formed over the support substrate, and a semiconductor layer formed over the insulating layer;

an element isolation layer between the transistor forming region and the capacitor forming region;

a projection provided within a periphery of the capacitor forming region of the semiconductor layer;

a capacitor groove provided in the insulating layer;

a gate insulating film over the semiconductor layer, over the element isolation layer, and within the capacitor groove;

a floating gate electrode over the gate insulating film, the floating gate electrode dividing the semiconductor layer at an end portion of the transistor forming region, overlapping a doped region of the MOSFET, and overlapping the projection of the semiconductor layer of the capacitor forming region;

a source and a drain of the MOSFET; and a capacitor electrode of the MOS capacitor;

wherein the capacitor groove includes an undercut portion below the projection.

2. The semiconductor memory device of claim 1, wherein the projection includes an inclined surface.

3. The semiconductor memory device of claim 1, wherein the inclined surface of the projection substantially entirely overlaps the capacitor groove.

* * * * *